United States Patent
Fujimori

(10) Patent No.: US 7,785,024 B2
(45) Date of Patent: Aug. 31, 2010

(54) IMAGING APPARATUS AND METHOD OF MANUFACTURING THE SAME

(75) Inventor: Noriyuki Fujimori, Nagano (JP)

(73) Assignee: Olympus Corporation, Tokyo (JP)

( * ) Notice: Subject to any disclaimer, the term of this patent is extended or adjusted under 35 U.S.C. 154(b) by 681 days.

(21) Appl. No.: 11/492,264

(22) Filed: Jul. 25, 2006

(65) Prior Publication Data

US 2007/0019952 A1 Jan. 25, 2007

(30) Foreign Application Priority Data

Jul. 25, 2005 (JP) .............................. 2005-214826

(51) Int. Cl.
 *G03B 17/00* (2006.01)
 *H04N 5/225* (2006.01)
 *G02B 7/02* (2006.01)
(52) U.S. Cl. .................. 396/529; 348/340; 359/819
(58) Field of Classification Search ................. 396/529, 396/535; 348/230.01, 272, 294, 335, 340, 348/374; 257/684; 313/529, 535; 359/811, 359/819
See application file for complete search history.

(56) References Cited

U.S. PATENT DOCUMENTS

| | | | |
|---|---|---|---|
| 6,483,179 B2 * | 11/2002 | Iizima et al. ................. | 257/680 |
| 7,110,033 B2 | 9/2006 | Miyake | |
| 2001/0015767 A1 | 8/2001 | Miyake ....................... | 348/374 |
| 2001/0020738 A1 | 9/2001 | Iizima et al. | |
| 2001/0027873 A1 | 10/2001 | Miyake | |
| 2001/0050721 A1 | 12/2001 | Miyake | |
| 2004/0188699 A1 | 9/2004 | Kameyama et al. | |
| 2005/0275741 A1 * | 12/2005 | Watanabe et al. ........... | 348/340 |

FOREIGN PATENT DOCUMENTS

| | | |
|---|---|---|
| CN | 1314600 A | 9/2001 |
| EP | 1 130 905 A2 | 9/2001 |
| EP | 1 148 716 A1 | 10/2001 |
| JP | 58-089844 | 5/1983 |
| JP | 2001-238103 | 8/2001 |
| JP | 2001-292354 | 10/2001 |
| JP | 2003-110945 | 4/2003 |
| JP | 2004-207494 | 7/2004 |
| JP | 2004-221875 | 8/2004 |

* cited by examiner

*Primary Examiner*—Rochelle-Ann J Blackman
(74) *Attorney, Agent, or Firm*—Scully, Scott, Murphy & Presser, P.C.

(57) ABSTRACT

An imaging apparatus includes a solid-state imaging sensor. The sensor includes a semiconductor chip receiving light from an object through a light receiving surface and performing photoelectric conversion of the received light; a translucent member provided on an upper surface of the chip to protect the chip; and plural electrode terminals provided on a lower surface of the chip. The apparatus also includes an optical system which is provided on a light receiving region, which is on a surface of the translucent member and is arranged at a position facing with the light receiving surface to focus the light from the object on the light receiving surface; and a resin material which reinforces a bonding strength between a circuit board on which the sensor is mounted and the electrode terminals of the sensor, and shields a region outside the light receiving region of the translucent member from light.

8 Claims, 9 Drawing Sheets

US 7,785,024 B2

IMAGING APPARATUS AND METHOD OF MANUFACTURING THE SAME

CROSS-REFERENCE TO RELATED APPLICATIONS

This application is based upon and claims the benefit of priority from Japanese Patent Application No. 2005-214826, filed Jul. 25, 2005, the entire contents of which are incorporated herein by reference.

BACKGROUND OF THE INVENTION

1. Field of the Invention

The present invention relates to an imaging apparatus which acquires an image of an object by receiving light from the object and performing a photoelectric conversion, and a method of manufacturing the imaging apparatus.

2. Description of the Related Art

Conventionally, a small imaging apparatus is proposed for incorporation into digital cameras, video cameras, and portable terminals such as mobile telephones and Personal Digital Assistants (PDA) provided with a function of camera. The imaging apparatus acquires an image of an object by receiving light from the object and performing photoelectric conversion of the received light. Such an imaging apparatus includes a solid-state imaging sensor such as a charge coupled device (CCD) or a complementary metal-oxide semiconductor (CMOS) image sensor, and an optical system which focuses light from the object on a light receiving surface of the solid-state imaging sensor to form the image (see, JP-A No. 2003-110945 (KOKAI), for example).

In recent years, such an imaging apparatus has come to be incorporated into medial devices such as endoscopes and capsule endoscopes. These medical devices are employed for observation of an inside of alimentary tracts of a subject, for example. Therefore, further downsizing of the imaging apparatus is highly desirable. For the downsizing, the imaging apparatus is formed of a chip-size package (CSP) type solid-state imaging sensor. The CSP is a package of substantially the same outer dimension as a semiconductor chip. FIG. 8 is a schematic cross-sectional view showing a side cross section structure of a conventional imaging apparatus including such a CSP-type solid-state imaging sensor As shown in FIG. 8, a conventional imaging apparatus 101 includes a CSP-type solid-state imaging sensor 102 which has a light receiving unit 102a for reception of light from an object, an optical system 103 which focuses light from the object on a light receiving surface of the light receiving unit 102a, a circuit board 104 on which the solid-state imaging sensor 102 is mounted, and a resin material 105 which reinforces the packaging strength of the solid-state imaging sensor 102 and the circuit board 104. The solid-state imaging sensor 102 has a cover glass 102b which protects a semiconductor chip (CCD chip, for example) on which the light receiving unit 102a is formed, and solder balls 102c. The optical system 103 includes a lens 103a which focuses light from the object onto the light receiving unit 102a, a barrel member 103b which protects the lens 103a and delineates a light receiving region 103d on a surface of the cover glass 102b, and a light blocking wall 103c which shields a region outside the light receiving region 103d of the cover glass 102b from light. The barrel member 103b has a through hole inside. An opening at one end of the through hole is closed by holding the lens 103a, whereas an opening at another end of the through hole delineates the light receiving region 103d on the cover glass 102b at a position corresponding to the light receiving unit 102a. The light blocking wall 103c has a substantially reverse-U-shaped cross section. The light blocking wall 103c engages with the cover glass 102b so as to cover a region (upper surface and side surfaces of the cover glass 102b) other than the light receiving region 103d of the cover glass 102b.

When the imaging apparatus 101 is employed for imaging of the object, light from the object comes into the barrel member 103b through the lens 103a, and passes through the light receiving region 103d to be focused onto the light receiving surface of the light receiving unit 102a. The light receiving unit 102a then, performs photoelectric conversion on the focused light from the object, to generate an image signal of the object. Here, since the light blocking wall 103c blocks the light so that the light would not be incident on the region other than the light receiving region 103d of the cover glass 102b, the light receiving unit 102a receives only the light that comes from the object and enters into the barrel member 103b through the lens 103a.

SUMMARY OF THE INVENTION

An imaging apparatus according to one aspect of the present invention includes a solid-state imaging sensor. The solid-state imaging sensor includes a semiconductor chip that receives light from an object through a light receiving surface and performs photoelectric conversion of the received light; a translucent member that is provided on an upper surface of the semiconductor chip to protect the semiconductor chip; and plural electrode terminals provided on a lower surface of the semiconductor chip. The apparatus also includes an optical system which is provided on a light receiving region to focus the light from the object on the light receiving surface, the light receiving region being on a surface of the translucent member and being arranged at a position facing with the light receiving surface; and a resin material which reinforces a bonding strength between a circuit board on which the solid-state imaging sensor is mounted and the electrode terminals of the solid-state imaging sensor, and shields a region outside the light receiving region of the translucent member from light.

A method of manufacturing an imaging apparatus according to another aspect of the present invention includes joining plural electrode terminals of a solid-state imaging sensor and a circuit board, the solid-state imaging sensor including a translucent member provided on an upper surface of a semiconductor chip, and the electrode terminals provided on a lower surface of the semiconductor chip, the semiconductor chip receiving light from an object through a light receiving surface and performing photoelectric conversion; arranging an optical system on a light receiving region on a surface of the translucent member, the light receiving region facing the light receiving surface, the optical system focusing the light from the object on the light receiving surface; and reinforcing a bonding strength between the circuit board and the semiconductor chip by filling a gap between the circuit board and the semiconductor chip with a light-blocking resin material and by covering a region outside the light receiving region of the translucent member to block light.

A method of manufacturing an imaging apparatus according to still another aspect of the present invention includes arranging an optical system on a light receiving region on a surface of a translucent member of a solid-state imaging sensor, the light receiving region facing a light receiving surface of the solid-state imaging sensor, the optical system focusing light from an object on the light receiving surface, the solid-state imaging sensor including the translucent member provided on an upper surface of the semiconductor chip, and plural electrode terminals provided on a lower surface of the semiconductor chip, the semiconductor chip receiving light from the object through the light receiving surface and performing photoelectric conversion; joining the electrode terminals and the circuit board; and reinforcing a bonding strength between the circuit board and the semiconductor chip by filling a gap between the circuit board and the semiconductor chip with a light-blocking resin material, and by covering a region outside the light receiving region of the translucent member to block light.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of an imaging apparatus and a method of manufacturing the imaging apparatus according to the present invention will be described in detail with reference to the accompanying drawings. The present invention is not limited to the embodiments.

Figure 1:
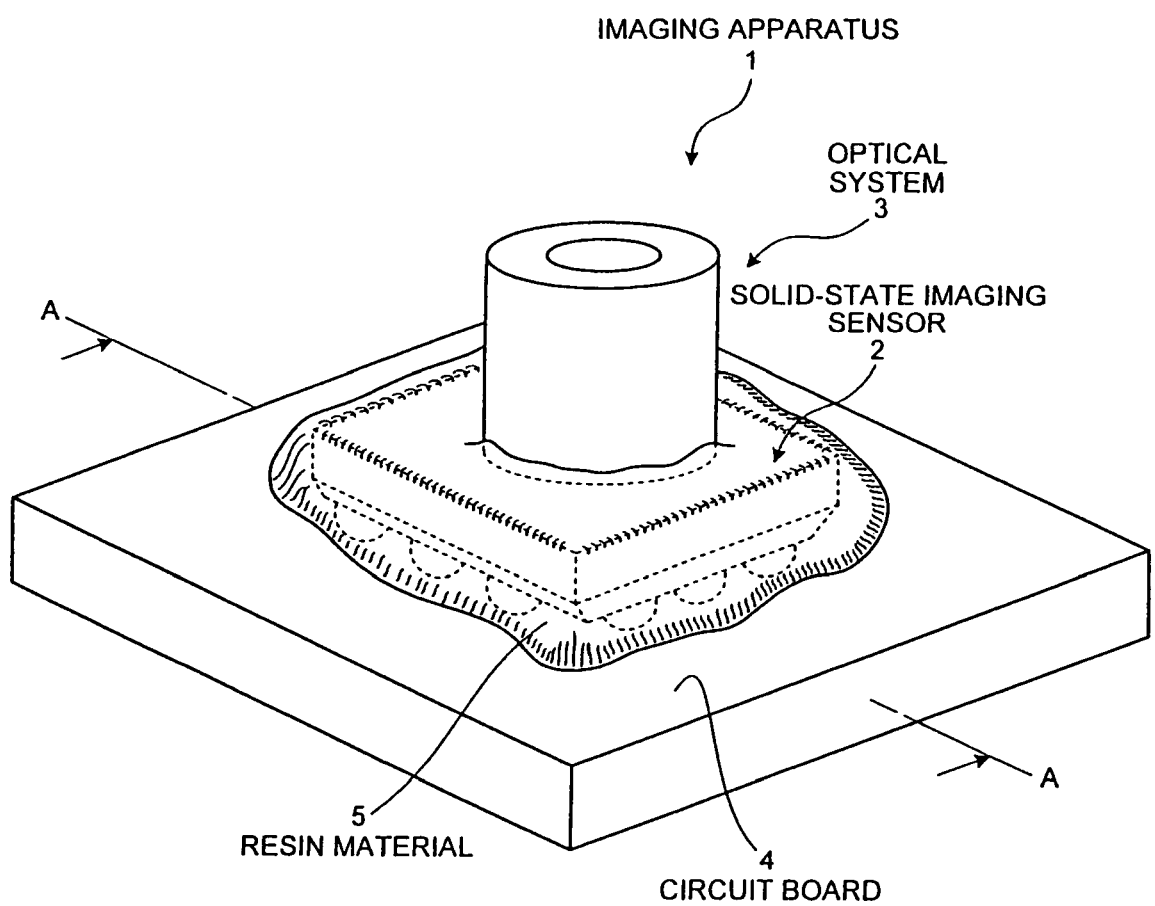
FIG. 1 is a schematic perspective view of an example of a structure of an imaging apparatus according to a first embodiment of the present invention.

FIG. 1 is a perspective view schematically showing an example of a structure of an imaging apparatus according to a first embodiment of the present invention. As shown in FIG. 1, an imaging apparatus 1 includes a solid-state imaging sensor 2, an optical system 3, a circuit board 4, and a resin material 5. The solid-state imaging sensor 2 receives light from an object and performs photoelectric conversion on the received light to acquire an image of the object. The optical system 2 focuses the light from the object on a light receiving surface of the solid-state imaging sensor 2. The solid-state imaging sensor 2 is mounted on the circuit board 4. The resin material 5 reinforces a packaging strength of the solid-state imaging sensor 2 and the circuit board 4. The resin material 5 shields a region other than a light receiving region (described later) of the solid-state imaging sensor 2 from light.

Specifically, the solid-state imaging sensor 2 is packaged as the CSP. The optical system 2 is arranged on an upper surface of the solid-state imaging sensor 2. A lower surface of the solid-state imaging sensor 2 is attached to the circuit board 4. The solid-state imaging sensor 2 mounted on the circuit board 4 is covered by the resin material 5 so that only a region where the optical system 3 is arranged is exposed (i.e., so that a region other the light receiving region of the solid-state imaging sensor 2 is covered). The resin material 5 fills up a space between the solid-state imaging sensor 2 and the circuit board 4.

Figure 2:
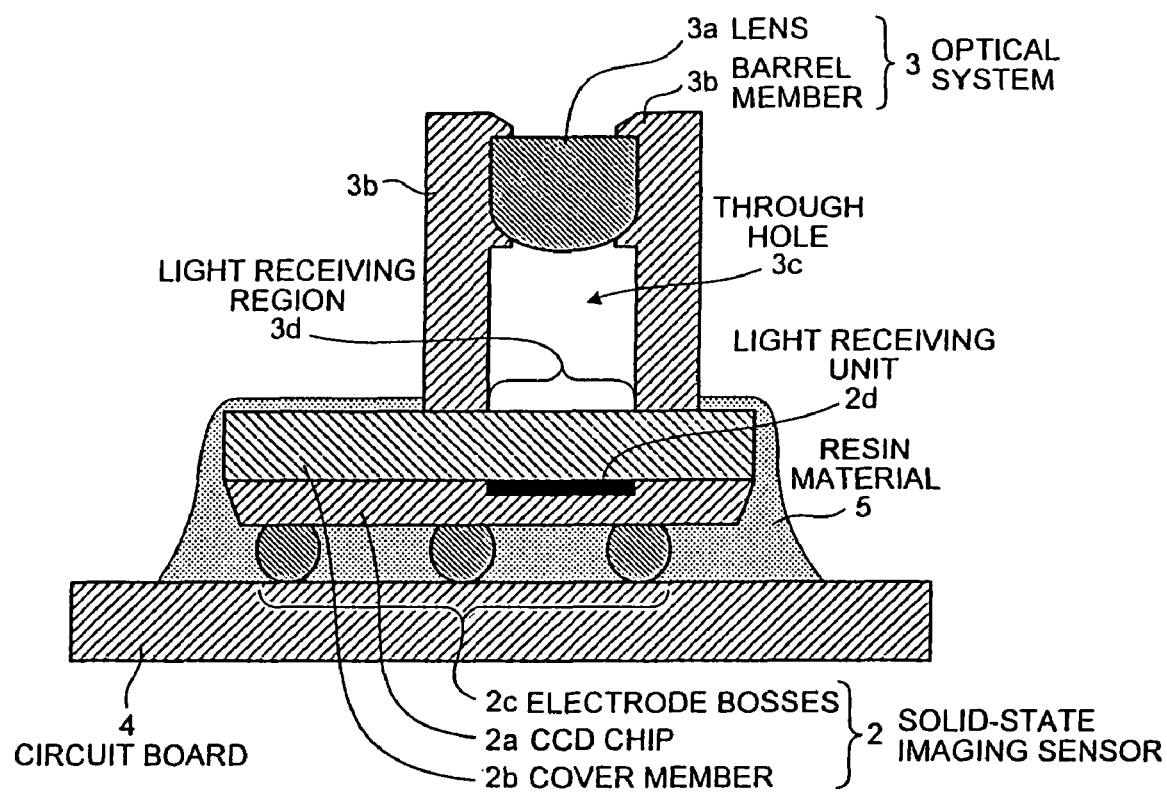
FIG. 2 is a schematic cross-sectional view taken along line A-A of FIG. 1.

FIG. 2 is an exemplary schematic cross-sectional view of a side section structure of the imaging apparatus shown in FIG. 1. As shown in FIG. 2, the solid-state imaging sensor 2 includes a CCD chip 2a, a cover member 2b, and electrode bosses 2c. The CCD chip 2a has a function of acquiring an image of the object by receiving the light from the object by the light receiving unit 2d and performing photoelectric conversion. The cover member 2b protects an upper surface of the CCD chip 2a, i.e., a surface on which the light receiving unit 2d is formed. The electrode bosses 2c serves to electrically connect the CCD chip 2a and the circuit board 4 and to physically join (in other words, mount) the CCD chip 2a on the circuit board 4.

The CCD chip 2a is a semiconductor chip which has a function of receiving the light from the object through the light receiving surface and performing photoelectric conversion on the received light to acquire an image of the object. The CCD chip 2a has the light receiving unit 2d at the upper surface side. The light receiving unit 2d includes plural pixels each including a photoelectric transducer. The light receiving unit 2d receives the light from the object through the light receiving surface and performs photoelectric conversion on the received light to generate an electric signal corresponding to the image of the object (image signal). Each side (vertical or horizontal) of the rectangular CCD chip 2a is approximately 1 to 10 mm in length, and thickness of the CCD chip 2a is approximately 0.1 to 0.5 mm.

The cover member 2b serves to protect the CCD chip 2a without obstructing the reception of the light from the object by the light receiving unit 2d. Specifically, the cover member 2b is a translucent member made of translucent glass, resin, or the like, and made to stick to the upper surface of the CCD chip 2a, i.e., a side the light receiving unit 2d is formed. The cover member 2b protects the CCD 2a, and the light receiving unit 2d in particular. An outer dimension of the cover member 2b corresponds to the dimension of the rectangular CCD chip 2a described above. Each side (vertical or horizontal) of the rectangular cover member 2b is approximately 1 to 10 mm, and thickness of the cover member 2b is approximately 0.1 to 0.5 mm.

The electrode bosses 2c function as external electrodes through which the CSP-type solid-state imaging sensor 2 is mounted on the circuit board 4, and which electrically connects the solid-state imaging apparatus 2 and the circuit board 4. Specifically, the electrode bosses 2c is an external electrode made of plural solder balls or gold bumps. The electrode bosses 2c are arranged on a lower surface side of the CCD chip 2a, i.e., at the back of the side of the light receiving unit 2d is formed. Here, the electrode bosses 2c are arranged corresponding to the arrangement of electrodes (not shown) of the circuit board 4. For example, the electrode bosses 2c are arranged like a matrix on the lower surface of the CCD 2a. Contrarily, the electrodes of the circuit board 4 may be arranged corresponding to the arrangement of the electrode bosses 2c. The electrode bosses 2c are subjected to a heating treatment of not less than a predetermined temperature, melted, and joined with the electrodes of the circuit board 4. Thus, the solid-state imaging sensor 2 (more specifically, CCD chip 2a) is mounted on the circuit board 4 via the electrode bosses 2c.

The optical system 3 includes a lens 3a that focuses light from the object on the light receiving unit 2d, and a barrel member 3b that holds the lens 3a. The lens 3a makes the light from the object pass through the barrel member 3b, and focuses the light from the object on the light receiving unit 2d to form an image. Here, the lens in the optical system 3 may be a single lens 3a as shown in FIG. 2; alternatively the lens may be a combination of plural lenses.

The barrel member 3b is a cylindrical member in which a through hole 3c is formed. An opening at one end of the through hole 3c is closed holding the lens 3a. The barrel member 3b is arranged on an upper surface of the solid-state imaging sensor 2 (specifically, on the upper surface of the cover member 2b) as shown in FIG. 2. The barrel member 3b delineates a light receiving region 3d on the surface of the cover member 2b at a position corresponding to the position of the light receiving unit 2d. The barrel member 3b serves to keep the lens 3a and the light receiving unit 2d at a fixed distance from each other to allow an acquisition of a desired optical image. The light receiving region 3d is a region on the surface of the cover member 2b, and the light from the object coming into the through hole 3c through the lens 3a passes through the light receiving region 3d before being focused on the light receiving unit 2d. The barrel member 3b functions so as to make the light from the object coming into the through hole 3c through the lens 3a reach the light receiving region 3d, and to block external light incident on the casing of the barrel member 3b (more specifically, external light other than the light from the object).

The circuit board 4 is fabricated as a plate-like printed circuit board or a flexible circuit board, or a combination of both. Specifically, an electrode and circuit wiring are formed on the circuit board 4 and the solid-state imaging sensor 2 is mounted via the electrode bosses 2c as described above. Further, various devices (not shown) other than the solid-state imaging sensor 2 are mounted on the circuit board 4 as necessary. For example, an image processing device may be mounted for performing a predetermined image processing on an image signal output from the solid-state imaging sensor 2 to configure the image of the object.

The resin material 5 serves to reinforce the packaging strength of the solid-state imaging sensor 2 and the circuit board 4, and to shield the region other than the light receiving region 3d of the cover member 2b from the light. Specifically, the resin material 5 is a sealing resin that is employed in a sealing process of a semiconductor element or an underfill agent that is employed as a strengthening agent for a package of CSP-type or BGA-type semiconductor element. For example, the resin material 5 is a black resin such as black epoxy-based resin, silicone-based resin, or polyimide-based resin. The resin material 5 fills up the gap between the CCD chip 2a of the solid-state imaging sensor 2 mounted on the circuit board 4 and the circuit board 4 to reinforce the packaging strength of the solid-state imaging sensor 2 and the circuit board 4. At the same time, the resin material 5 covers a region other than the light receiving region 3d of the cover member 2b (specifically an upper surface and side surfaces of the cover member other than the surface where the light receiving region 3d is formed) and forms a light blocking film. Such light blocking film shields the region other than the light receiving region 3d of the cover member 2b and prevents the external light other than the light from the object from coming into the light receiving unit 2d through the cover member 2b. The resin material 5 is applied in a fluid state onto the solid-state imaging sensor 2 and the circuit board 4. Hence, regardless of the outer shape of the solid-state imaging sensor 2, i.e., the CCD chip 2a, and the outer shape of the cover member 2b, the resin material 5 can form the above-described light blocking film flexibly, and at the same time the resin material 5 can reinforce the packaging strength of the solid-state imaging sensor 2 and the circuit board 4.

The packaging strength of the solid-state imaging sensor 2 and the circuit board 4 is an anchorage strength of the solid-state imaging sensor 2 with respect to the circuit board 4, for example, and includes a bonding strength of the electrode bosses 2c to the circuit board 4 and a bonding strength of the electrode bosses 2c to the CCD chip 2a. Since the optical system 3 is attached to the solid-state imaging sensor 2 in the imaging apparatus of the first embodiment, an overall height of the imaging apparatus increases. When an external force is applied to the optical system 3 (the barrel member 3b, for example), stress may concentrate on a bonding portion between each of the electrode bosses 2c and the circuit board 4, or a bonding portion between the electrode bosses 2c and the CCD chip 2a. Therefore, the packaging strength of the solid-state imaging sensor 2 and the circuit board 4 is required to be higher than packaging strength generally required for an integrated circuit (IC) or large scale integrated circuit (LSI). In the first embodiment, the resin material 5 is formed so as to fill up all the gaps between the CCD chip 2a and the circuit board 4. The present invention, however, is not limited to such a manner of resin material formation. The resin material 5 may partially fill up the gaps between the CCD chip 2a and the circuit board 4; or the resin material 5 may not fill up the gap at all, as far as a desirable packaging strength can be secured.

The imaging apparatus 1 with the above-described structure receives light from the object through the lens 3a by the light receiving unit 2d, and performs photoelectric conversion on the received light from the object to generate an image signal of the object, thereby performing the imaging process of the image of the object. Here, the light from the object passes through the lens 3a to come inside the barrel member 3. Thereafter the light passes through the light receiving region 3d to be focused onto the light receiving surface of the light receiving unit 2d. The light receiving unit 2d receives the light from the object thus focused on the light receiving surface, and performs photoelectric conversion on the received light from the object to generate the image signal of the object. Then, the image signal of the object is subjected to a predetermined image process by an image processing unit. Thus, an image of the object is formed according to the image signal. The external light other than the light from the object does not reach the light receiving unit 2d blocked by the barrel member 3b and the resin material 5.

Figure 3:
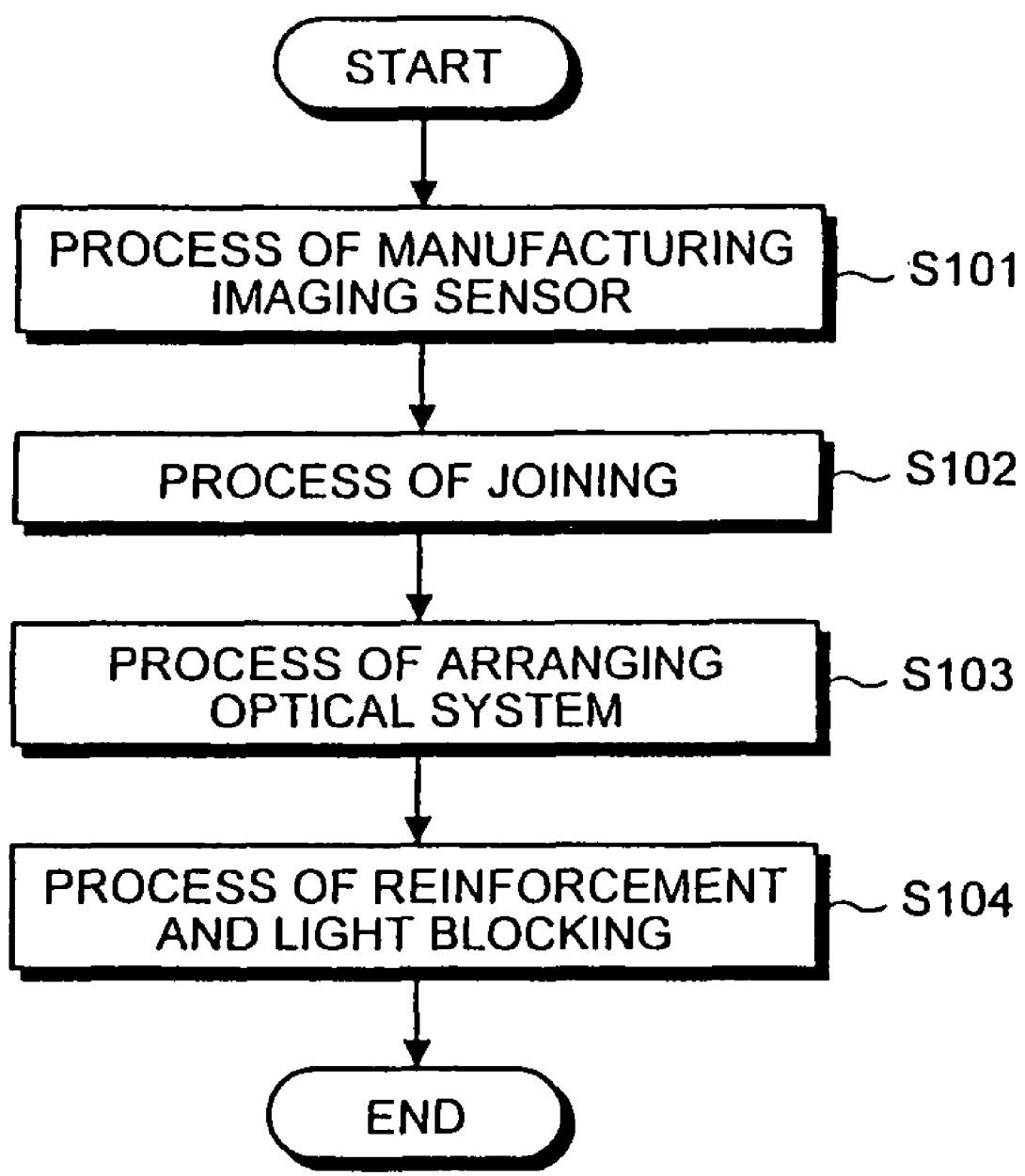
FIG. 3 is an exemplary flowchart of manufacture of the imaging apparatus according to the present invention.

A method of manufacturing the imaging apparatus 1 of the first embodiment of the present invention will be described. FIG. 3 is an exemplary flowchart of processes for manufacturing the imaging apparatus 1. As shown in FIG. 3, the cover member 2b is arranged on the upper surface of the CCD chip 2a. The electrode bosses 2c are arranged on the lower surface of the CCD chip 2a. The CCD chip 2a is turned into a CSP. Thus, the CSP-type solid-state imaging sensor 2 is manufactured (step S101). The CCD chips 2a, then, can be mounted on the circuit board 4.

Here, the cover member 2b and/or the electrode bosses 2c may be arranged on the CCD chip 2a which is formed as a semiconductor chip cut out from a silicon wafer; alternatively the cover member 2b and/or the electrode bosses 2c may be arranged on a CCD element in a sate of silicon wafer (i.e., CCD element before cut out from the silicon wafer), and the CCD chip 2a may be cut out later therefrom so that each includes the cover member 2b or the electrode bosses 2c.

Then, the electrode bosses 2c of the CSP-type solid-state imaging sensor 2 manufactured in step S101 are joined with an electrode of the circuit board 4 (step S102). The electrode bosses 2c are brought into contact with the electrode of the circuit board 4. Then, the electrode bosses 2c are heated and melted while in contact with the electrode of the circuit board 4. Thus the solid-state imaging sensor 2 is mounted on the circuit board 4. The solid-state imaging sensor 2 is fixed to the circuit board 4 by the melted electrode bosses 2c. The step 102 is not limited to the manner mentioned above. The solid-state imaging sensor 2 may be pressed onto the electrode of the circuit board 4 while the electrode bosses 2c are melted and adhered to the electrode of the circuit board 4. Alternatively, ultrasonic waves may be applied to the solid-state imaging sensor 2 and the circuit board 4 to make the electrode bosses 2c melted and adhered.

Thereafter, the optical system 3 is arranged on the cover member 2 of the solid-state imaging sensor 2 mounted on the circuit board 4 (step S103). The barrel member 3b of the optical system 3 is arranged so that the light receiving region 3d is formed on the surface of the cover member 2b at a position corresponding to the light receiving unit 2d. When the barrel member 3b is thus arranged, the lens 3a is located over the light receiving region 3d.

Then, the packaging strength of the solid-state imaging sensor 2 and the circuit board 4 is reinforced by the resin material 5, and at the same time, the resin material 5 shields the region outside the light receiving region 3d of the cover member 2b from light (step S104). Specifically, the resin material 5 is poured into the gaps between the mounted solid-state imaging sensor 2 (more specifically the CCD chip 2a) and the circuit board 4, thereby filling in the gaps and reinforcing the packaging strength of the solid-state imaging sensor 2 and the circuit board 4. At the same time, the resin material 5 covers the region outside the light receiving region 3d of the cover member 2b to form the light blocking film. The light blocking film shields the region outside the light receiving region 3d from the light. Thus, the imaging apparatus 1 as exemplified in FIGS. 1 and 2 is manufactured.

Figure 8:
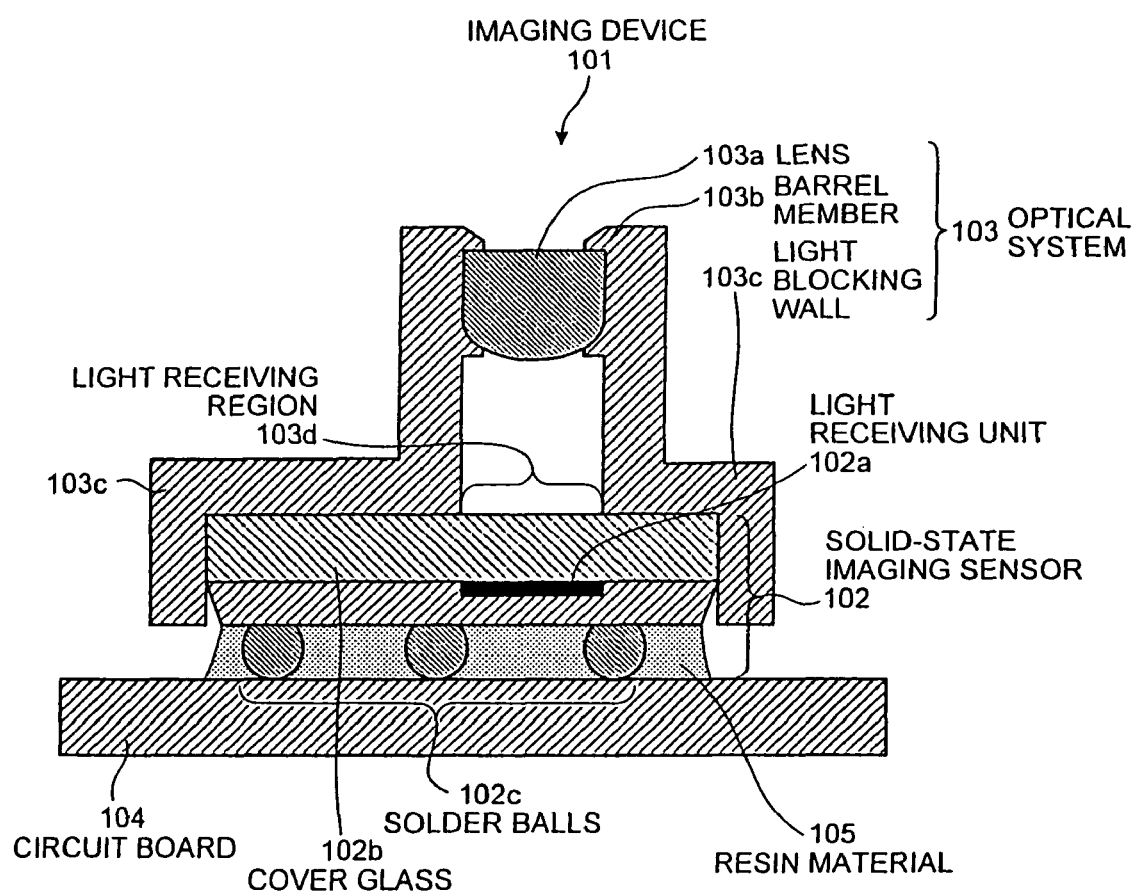
FIG. 8 is a schematic exemplary cross-sectional view of a side section structure of a conventional imaging apparatus.

As described above, in the first embodiment of the present invention, the gaps between the semiconductor chip of the solid-state imaging sensor and the circuit board is filled up by the light-blocking resin material, whereby the packaging strength is reinforced and the light blocking film is formed in the region outside the light receiving region of the cover member (translucent member) of the solid-state imaging sensor. Therefore, even when a casing structure of the light blocking wall (e.g., the light blocking wall 103c shown in FIG. 8) is not provided in the optical system that focuses the light from the object onto the light receiving surface of the solid-state imaging sensor, the resin material forms the light blocking film and shields the region outside the light receiving region of the translucent member from the light without fail. Further, a casing structure of the optical system can be simplified, which enhances the versatility of the optical system with respect to the outer dimension of the solid-state imaging sensor. Still further, a degree of freedom in positioning of the optical system with respect to the solid-state imaging sensor can be increased. Therefore, an imaging apparatus can be readily realized in which the optical system that focuses light from the object can be readily attached to the solid-state imaging sensor and in which unnecessary external light other than the light from the object can be surely blocked.

Further, since the resin material is applied in a fluid state to the region outside the light receiving region of the translucent member to form the light blocking film, the light blocking film can be formed flexibly regardless of the outer dimension and the size of the solid-state imaging sensor, i.e., the outer dimension of the translucent member, whereby the region outside the light receiving region of the translucent member can be surely shielded from light in the solid-state imaging sensor of a desired outer dimension and size.

Since the imaging apparatus according to the present invention in which the light blocking film is formed of the resin material does not need the casing structure of the light blocking wall as described above, the scale of the imaging apparatus can be reduced, and therefore the imaging apparatus of the present invention is suitable as a small imaging apparatus to be incorporated into digital camera, video camera, portable terminals such as mobile telephone with a camera function, and PDA with a camera function, and medical devices such as endoscope or capsule endoscope that is employed for observation of inside a subject, such as an inside of alimentary tracts of a subject.

A second embodiment of the present invention will be described. An imaging apparatus according to the second embodiment further includes a positioning unit in a barrel member of an optical system that is placed on an upper surface of a solid-state imaging sensor. The positioning unit determines an attachment position in the solid-state imaging sensor.

Figure 4:
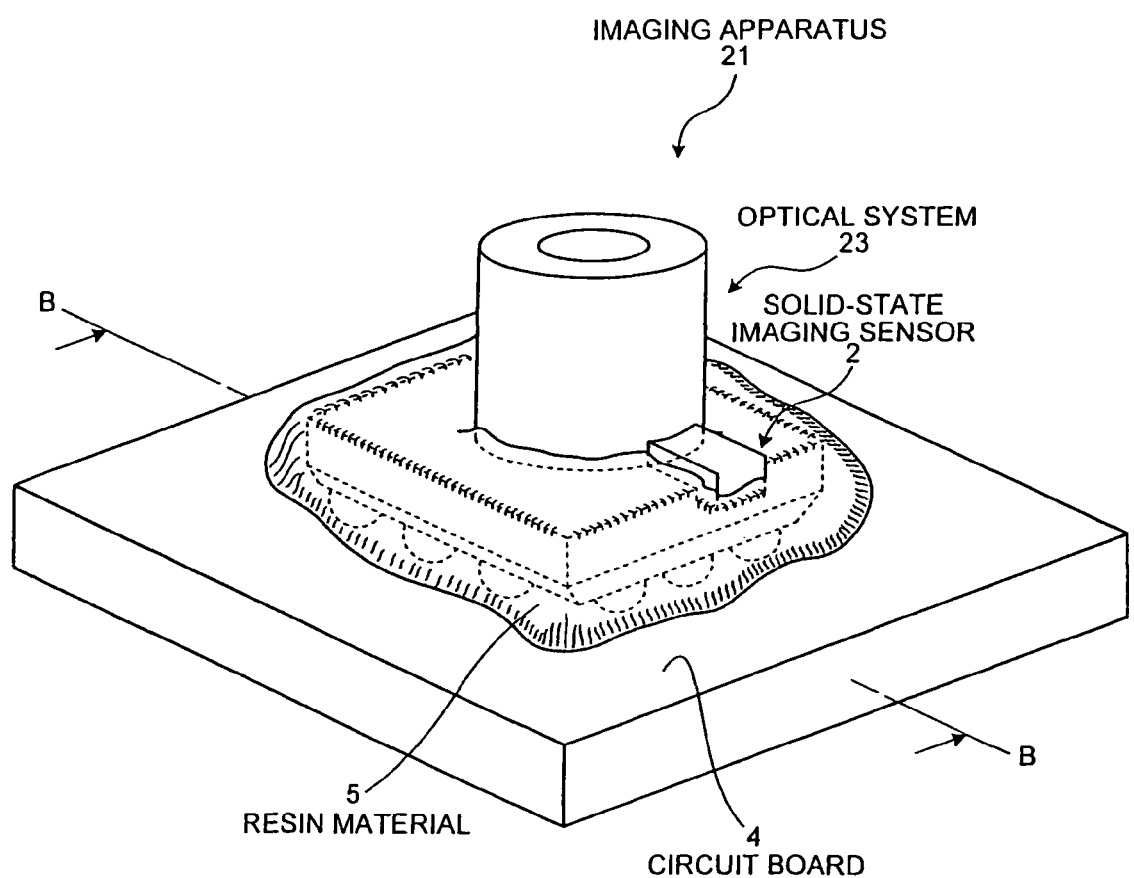
FIG. 4 is a schematic perspective view of an example of a structure of an imaging apparatus according to a second embodiment of the present invention.
Figure 5:
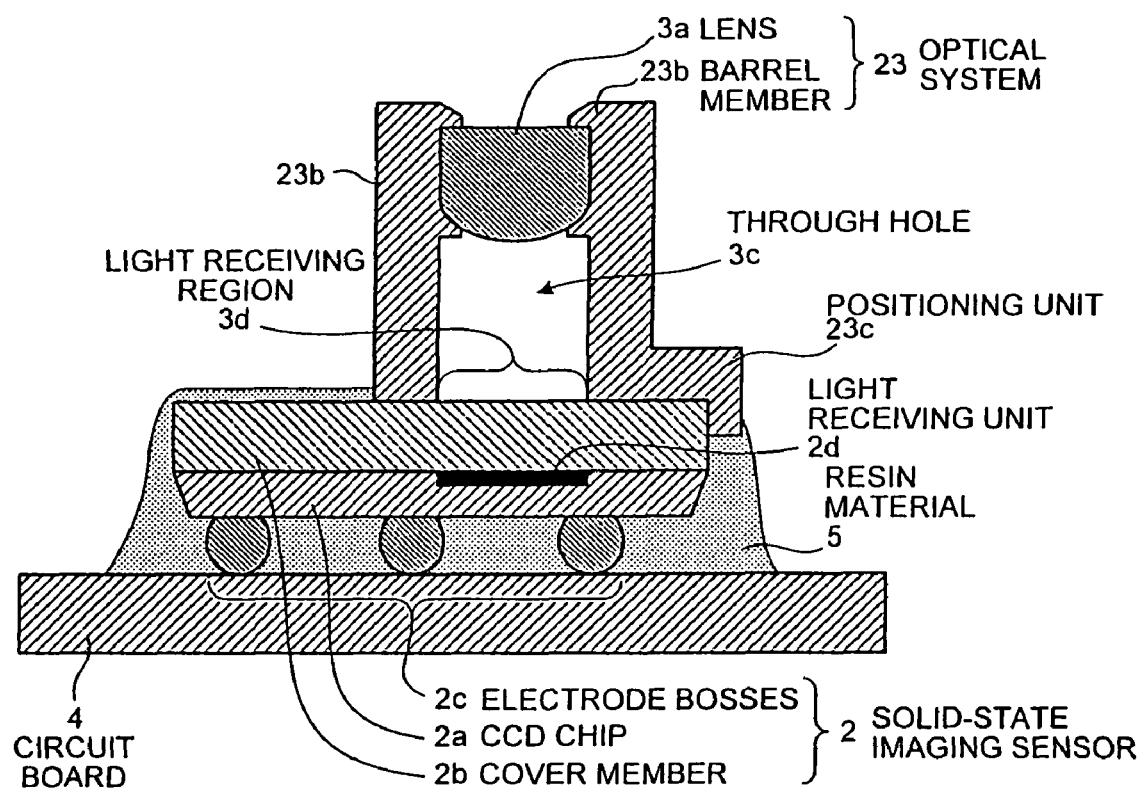
FIG. 5 is a schematic cross-sectional view taken along line B-B of FIG. 4.

FIG. 4 is a perspective view schematically showing an example of a structure of the imaging apparatus according to the second embodiment of the present invention. FIG. 5 is a schematic cross-sectional view taken along line B-B and schematically shows an exemplary side section structure of the imaging apparatus shown in FIG. 4. As shown in FIGS. 4 and 5, an imaging apparatus 21 includes an optical system 23 in place of the optical system 3 of the imaging apparatus 1 of the first embodiment described above. Other structure of the second embodiment is the same as the structure of the first embodiment and the same elements are denoted by the same reference characters.

The optical system 23 includes the lens 3a, and a barrel member 23b which has a positioning unit 23c mentioned above at one end. The through hole 3c is formed inside the barrel member 23b and an opening at one end of the through hole 3c is closed by holding the lens 3a. The barrel member 23b, similarly to the barrel member 3b described above, delineates the light receiving region 3d on the upper surface of the cover member 2b at a position corresponding to the light receiving unit 2d.

The positioning unit 23c is formed at the end of the barrel member 23b at the side of cover member 2b. The positioning unit 23c is formed in a shape fittable to a rim of the cover member 2b. For example, the positioning unit 23c has a substantially L-shaped sectional structure. The positioning unit 23c is caught by the rim of the cover member 2b, thereby restricting and determining the attachment position of the optical system 23 (specifically, the barrel member 23b) on the cover member 2b.

Figure 6:
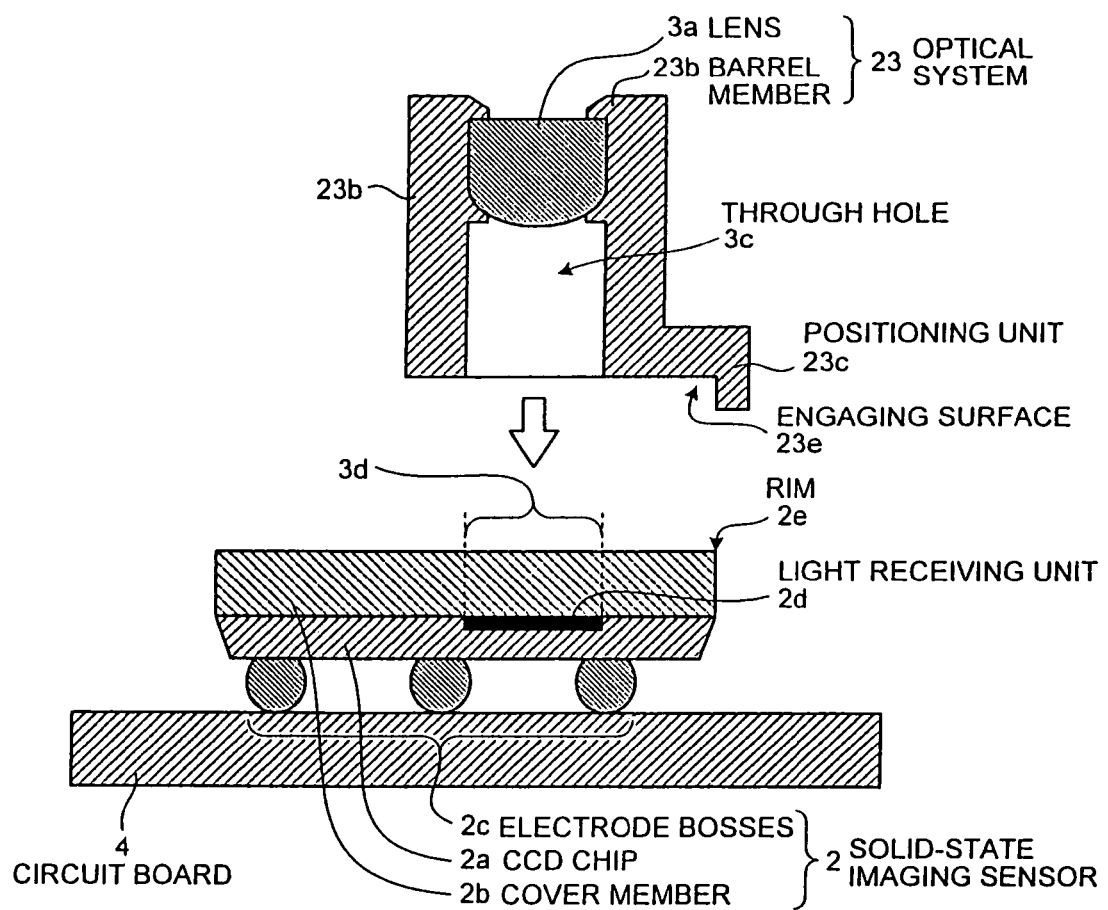
FIG. 6 is a schematic diagram showing a function of a positioning unit that determines an attachment position of an optical system.

FIG. 6 is a schematic diagram showing a function of the positioning unit 23c that determines the attachment position of the optical system 23 on the upper surface of the solid-state imaging sensor 2. As shown in FIG. 6, the positioning unit 23c has an engaging surface 23e which is provided at a side that is brought into contact with the cover member 2b and is able to engage with a rim 2e of the cover member 2d. The attachment position of the optical system 23 having the positioning unit 23c on the cover member 2b is determined by the engagement of the engaging surface 23e and the rim 2e when the optical system 23 is placed on the upper surface of the cover member 2b. When the optical system 23 (more specifically the barrel member 23b) is fixed onto the cover member 2b at the attachment position determined as described above, the opening of the through hole 3c can be readily aligned with the light receiving region 3d with high accuracy.

The imaging apparatus 21 with the above described structure can be manufactured by sequentially conducting the processes of S101 to S104 of the first embodiment. In the step of arranging the optical system 23 on the upper surface of the solid-state imaging sensor 2 (step S103), an optimal attachment position of the optical system 23 can be readily determined by the positioning unit 23c, whereby the optical system 23 can be fixed onto the cover member 2b while the opening of the through hole 3c is aligned with the light receiving region 3d with high accuracy.

As described above, according to the second embodiment of the present invention, the imaging apparatus can be provided in which: the imaging apparatus has the structure of the first embodiment; the positioning unit is formed in the barrel member of the optical system to determine the attachment position of the optical system on the upper surface of the solid-state imaging sensor; the optimal attachment position of the optical system can be readily determined by the positioning unit when the optical system is attached to the solid-state imaging sensor; advantages of the first embodiment can be enjoyed; and the light receiving region, i.e., the region on the cover member (translucent member) corresponding to the light receiving surface of the solid-state imaging sensor can be readily aligned with the opening of the through hole of the optical system with high accuracy.

A third embodiment of the present invention will be described. The third embodiment provides a capsule endoscope incorporating the imaging apparatus 1 of the first embodiment inside a capsule-like casing.

Figure 9:
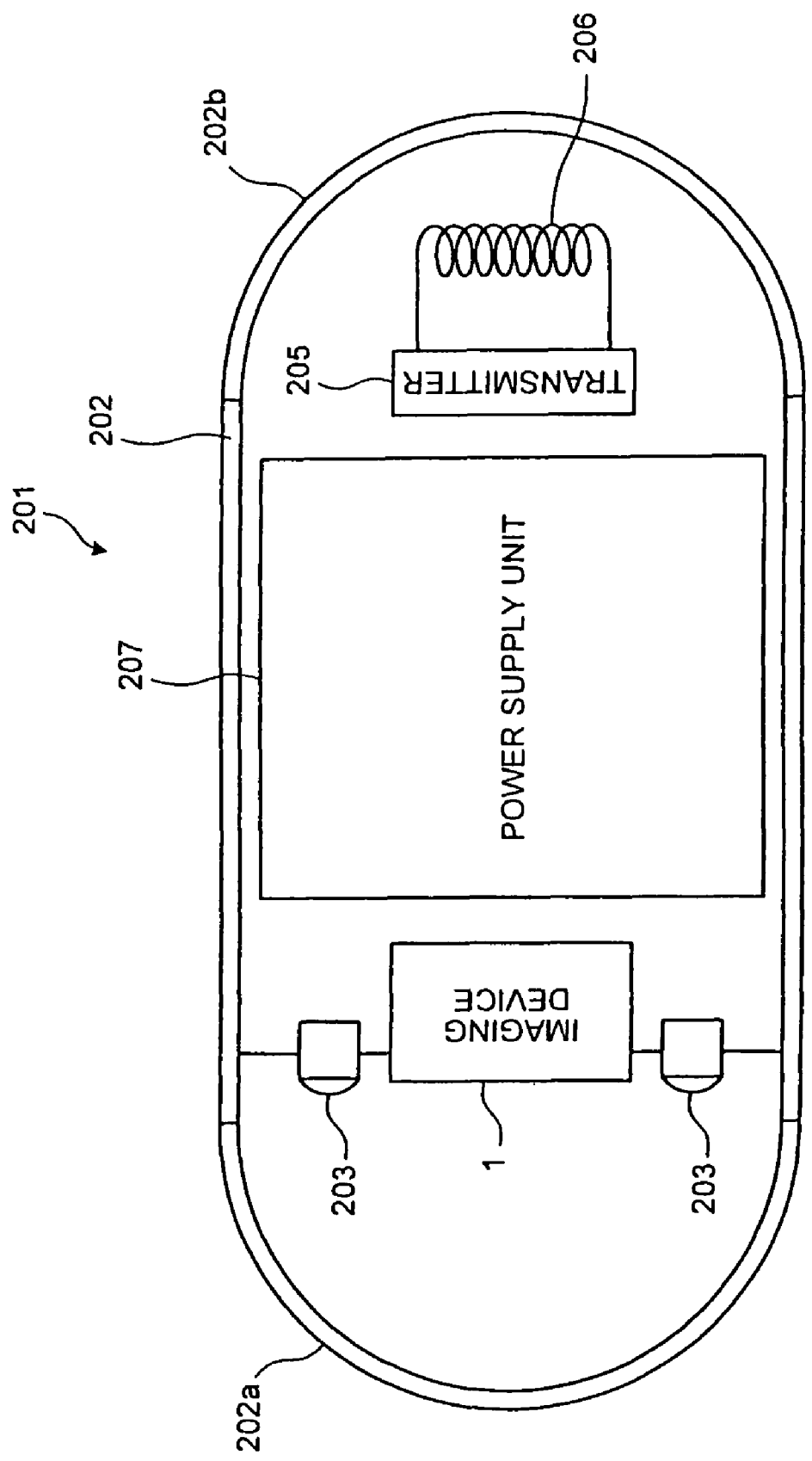
FIG. 9 is a schematic exemplary cross-sectional view of a capsule endoscope incorporating the imaging apparatus according to the first embodiment of the present invention.

FIG. 9 is a schematic cross-sectional view of the capsule endoscope incorporating the imaging apparatus 1 of the first embodiment of the present invention. As shown in FIG. 9, a capsule endoscope 201 has a capsule-like casing 202 which has a substantially cylindrical shape. The casing 202 includes an optical dome 202a formed of a transparent optical member on one end and an opaque dome 202b on another end. Further, the capsule endoscope 201 includes inside the casing 202 an imaging mechanism which images inside a body cavity to obtain image data, a radio mechanism which sends various types of information including the image data, and a power supply unit 207.

The imaging mechanism of the capsule endoscope 201 is arranged in the vicinity of the optical dome 202a. The imaging mechanism includes light sources 203 and the imaging apparatus 1. The light source 203 consists of a light emitting element such as a light emitting diode (LED) and illuminates an examined region inside the body cavity of a subject (not shown) through the optical dome 202a. The examined region in the body cavity illuminated with the light source 203 reflects the light. The imaging apparatus 1 receives the reflected light from the examined region inside the body cavity to obtain an image thereof. The imaging apparatus 1 includes the solid-state imaging sensor 2, the optical system 3, the circuit board 4, and the resin material 5 as described above. Here, the optical system 3 focuses the light that is reflected from the examined region inside the body cavity and enters through the optical dome 202a on the solid-state image sensor 2. The solid-state imaging sensor 2 obtains an image of the examined region inside the body cavity based on the reflected light focused by the optical system 3. The circuit board 4 sends an image signal corresponding to the obtained image to the radio mechanism of the capsule endoscope 201. Here, two light sources 203 are provided around the imaging apparatus 1 in FIG. 9. The number of light sources, however, is not limited to two, and may be one, three, or more.

The radio mechanism of the capsule endoscope 201 is provided near and inside the dome 202b. The radio mechanism includes a transmitter 205 and a transmitting antenna 206. The transmitter 205 modulates the image signal sent from the imaging apparatus 1 into an RF signal. The transmitting antenna 206 transmits electric waves of the RF signal generated by the transmitter 205 to a receiver (not shown) outside the subject. In other words, the transmitter 205 generates the RF signal and sends the RF signal to the receiver outside the subject using the transmitting antenna 206. The RF signal includes image data of the examined region inside the body cavity. The image data is obtained by the imaging apparatus 1.

The power source unit 207 supplies driving power to the imaging apparatus 1, the light sources 203, the transmitter 205, and the transmitting antenna 206. The capsule endoscope 201 may further include a receiver and a receiving antenna in order to receive various control signals transmitted by predetermined electric waves by an external device (not shown) and to control driving of the light sources 203, the imaging apparatus 1, or the like based on the received control signals.

In the capsule endoscope 201 with the above described structure which houses the imaging apparatus 1 inside the casing 202, the imaging apparatus 1 is formed to an ultrasmall size. Therefore, the casing 202 can be further downsized, which leads to further downsizing of the capsule endoscope. In addition, when such imaging apparatus 1 is incorporated, some space may remain in the casing where other mechanism can be arranged without enlargement of the casing 202. Therefore, additional mechanism for diagnosis, treatment, or the like, can be arranged in the capsule endoscope 201 as necessary.

In the first and the second embodiments of the present invention, the CCD chip 2a is employed as a semiconductor chip having an imaging function of the solid-state imaging sensor 2. The present invention, however, is not limited to the CCD chip. A CMOS chip may be employed in place of the CCD chip 2a and the solid-state imaging sensor 2 may be a CMOS image sensor.

Further, in the first and the second embodiments, the solid-state imaging sensor 2 is packaged as a CSP. The present invention, however, is not limited to such packaging manner. The solid-state imaging sensor may be packaged as a BGA (Ball Grid Array) package, or a LCC (Leadless Chip Carrier) package. Further, any packaging manner may be adaptable which implements the semiconductor chip of the solid-state imaging sensor and the circuit board by a flip chip connection.

Further, in the first and the second embodiments, the solid-state imaging sensor is mounted on the circuit board (step S102) and thereafter the optical system is arranged on the upper surface of the solid-state imaging sensor (step S103). The present invention, however, is not limited to the order of processes as described above. It is possible to arrange the optical system on the upper surface of the solid-state imaging sensor, and to mount the solid-state imaging sensor on the circuit board thereafter. In this case, the step S101 of manufacturing the imaging sensor is followed by the step S103 of arranging the optical system, and further by the step S102 of joining. After the processes from S101 to S103 are carried out in the order as described above, the step S104 of reinforcement and light blocking is performed. Thus, the imaging apparatus of the present invention can be manufactured.

Figure 7:
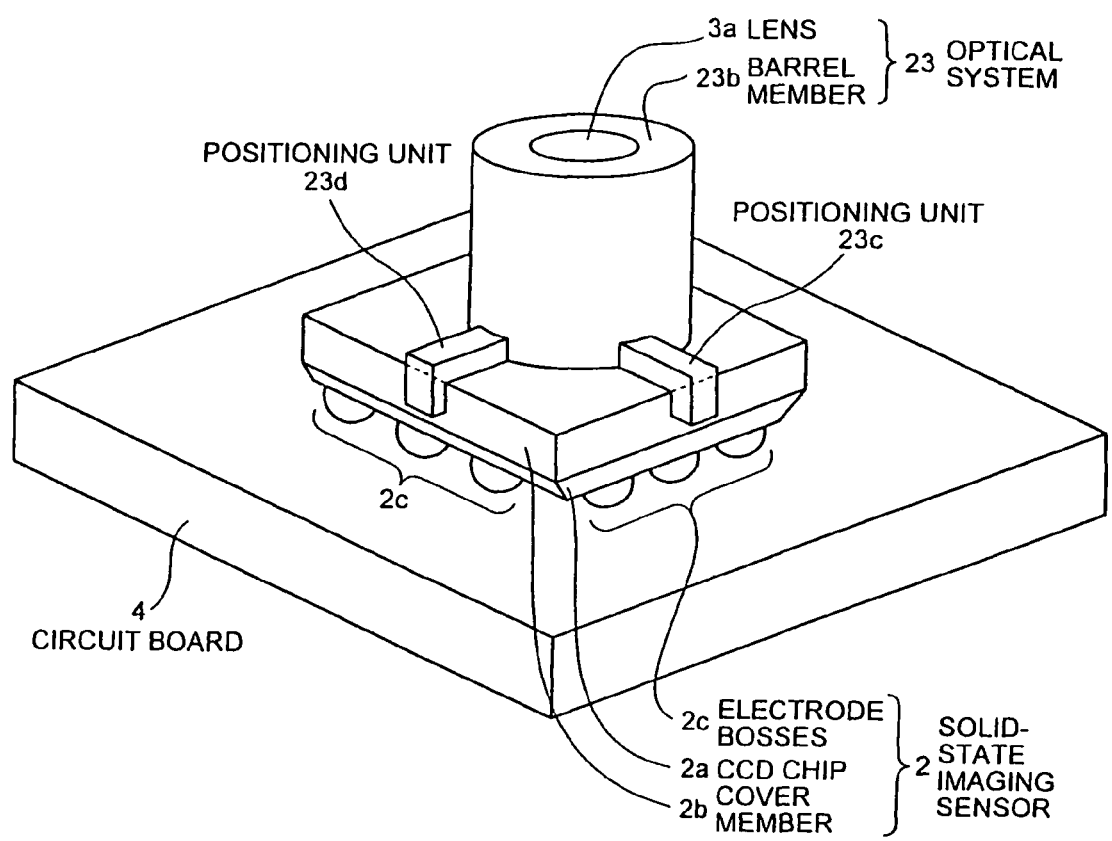
FIG. 7 is a schematic perspective view of an example of a structure of an imaging apparatus according to a modified example of the second embodiment of the present invention.

In the second embodiment, one positioning unit is formed in the barrel member of the optical system. The present invention, however, is not limited to one positioning unit. There may be plural positioning units in the barrel member of the optical system. FIG. 7 is a perspective view schematically showing an example of a structure of a modified example of the imaging apparatus 21 of the second embodiment of the present invention. In FIG. 7, the resin material 5 is not shown in order to clearly show plural positioning units. The optical system 23 of the imaging apparatus as the modified example has plural positioning units 23c and 23d corresponding respectively to two sides that run at right angles to one another of the cover member 2b, for example as shown in FIG. 7. The positioning unit 23d is formed in a shape fittable with a rim of the cover member 2b similarly to the positioning unit 23c. The positioning units 23c and 23d engage respectively with the rims of the cover member 2b when the optical system 23 is arranged on the upper surface of the solid-state imaging sensor 2, whereby the attachment position of the optical system 23 can be determined in widthwise and lengthwise directions of the upper surface of the cover member 2b. Thus, the optical system 23 can be securely arranged at an optimal attachment position.

In the third embodiment, the capsule endoscope 201 incorporates the imaging apparatus 1 according to the first embodiment. The present invention, however, is not limited to such a structure. The capsule endoscope 201 may incorporate the imaging apparatus 21 according to the second embodiment in place of the imaging apparatus 1 of the first embodiment.

In the third embodiment, the capsule endoscope 201 incorporate the imaging apparatus 1 of the first embodiment. The present invention, however, is not limited to such a structure. The imaging apparatus 1 or the imaging apparatus 21 of the present invention may be incorporated into capsule endoscope, endoscope, digital camera, and portable terminal having a camera function such as mobile telephone, and PDA. Devices incorporating the imaging apparatus 1 or the imaging apparatus 21 enjoy the advantages of the third embodiment described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging apparatus comprising:
   a solid-state imaging sensor, including
      a semiconductor chip that receives light from an object through a light receiving surface and performs photoelectric conversion of the received light,
      a translucent member that is provided on an upper surface of the semiconductor chip to protect the semiconductor chip, and
      plural electrode terminals that is provided on a lower surface of the semiconductor chip;
   an optical system that is provided on a light receiving region to focus the light from the object on the light receiving surface, the light receiving region being on a surface of the translucent member and being arranged at a position facing with the light receiving surface; and
   a resin material that reinforces a bonding strength between a circuit board on which the solid-state imaging sensor is mounted and the electrode terminals of the solid-state imaging sensor, and shields a region outside the light receiving region of the translucent member from light.

2. The imaging apparatus according to claim 1, wherein the resin material is a black resin.

3. The imaging apparatus according to claim 1, wherein the optical system includes a positioning unit that determines an attachment position on the translucent member.

4. The imaging apparatus according to claim 1, wherein the solid-state imaging sensor is packaged as a chip size package.

5. A method of manufacturing an imaging apparatus, comprising:
   forming a solid-state imaging sensor by arranging a translucent member on an upper surface of a semiconductor chip, and arranging plural electrode terminals on a lower surface of the semiconductor chip, the semiconductor chip receiving light from an object through a light receiving surface and performing photoelectric conversion;
   joining the plural electrode terminals of the solid-state imaging sensor and a circuit board;
   arranging an optical system on a light receiving region on a surface of the translucent member, the light receiving region facing the light receiving surface, the optical system focusing the light from the object on the light receiving surface, the optical system including a lens and a barrel member holding the lens; and
   reinforcing a bonding strength between the circuit board and the semiconductor chip by filling a gap between the circuit board and the semiconductor chip with a light-blocking resin material and by covering a region outside the light receiving region of the translucent member to block light.

6. A method of manufacturing an imaging apparatus comprising:
   forming a solid-state imaging sensor by arranging a translucent member on an upper surface of a semiconductor chip, and arranging plural electrode terminals on a lower surface of the semiconductor chip, the semiconductor chip receiving light from an object through a light receiving surface and performing photoelectric conversion;
   arranging an optical system on a light receiving region on a surface of the translucent member of the solid-state imaging sensor, the light receiving region facing the light receiving surface of the solid-state imaging sensor, the optical system focusing light from an object on the light receiving surface;
   joining the electrode terminals and a circuit board; and
   reinforcing a bonding strength between the circuit board and the semiconductor chip by filling a gap between the circuit board and the semiconductor chip with a light-blocking resin material, and by covering a region outside the light receiving region of the translucent member to block light.

7. The imaging apparatus according to claim 1, wherein:
   the optical system includes a lens and a barrel member which holds the lens and is arranged on and in contact with an upper surface of the translucent member; and
   the resin material covers a portion where the solid-state imaging sensor and the barrel member abut with each other and a portion where the solid-state imaging sensor and the circuit board abut with each other.

8. The imaging apparatus according to claim 3, wherein:
the optical system includes a lens and a barrel member which holds the lens and is arranged on and in contact with an upper surface at the translucent member;
the resin material covers a portion where the solid-state imaging sensor and the barrel member abut with each other and a portion where the solid-state imaging sensor and the circuit board abut with each other; and
the positioning unit is formed integrally with the barrel member of the optical system.

* * * * *